(12) United States Patent
Huang et al.

(10) Patent No.: US 10,163,828 B2
(45) Date of Patent: Dec. 25, 2018

(54) SEMICONDUCTOR DEVICE AND FABRICATING METHOD THEREOF

(71) Applicant: TAIWAN SEMICONDUCTOR MANUFACTURING COMPANY LTD., Hsinchu (TW)

(72) Inventors: Chang-Pin Huang, Taoyuan County (TW); Tung-Liang Shao, Hsinchu (TW); Hsien-Ming Tu, Hsinchu County (TW); Ching-Jung Yang, Taoyuan County (TW); Yu-Chia Lai, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 88 days.

(21) Appl. No.: 14/082,849

(22) Filed: Nov. 18, 2013

(65) Prior Publication Data

US 2015/0137350 A1 May 21, 2015

(51) Int. Cl.
  *H01L 23/00* (2006.01)
  *H01L 21/56* (2006.01)
  *H01L 23/31* (2006.01)

(52) U.S. Cl.
  CPC .............. *H01L 24/05* (2013.01); *H01L 24/04* (2013.01); *H01L 24/11* (2013.01); *H01L 24/13* (2013.01); *H01L 24/73* (2013.01); *H01L 21/563* (2013.01); *H01L 23/3114* (2013.01); *H01L 23/3157* (2013.01); *H01L 24/03* (2013.01); *H01L 24/06* (2013.01); *H01L 2224/0345* (2013.01); *H01L 2224/0346* (2013.01); *H01L 2224/0348* (2013.01); *H01L 2224/03452* (2013.01); *H01L 2224/0401* (2013.01); *H01L 2224/05008* (2013.01); *H01L 2224/05009* (2013.01); *H01L 2224/05022* (2013.01); *H01L 2224/0558* (2013.01); *H01L 2224/05111* (2013.01); *H01L 2224/05124* (2013.01);

(Continued)

(58) Field of Classification Search
  CPC ....... H01L 24/11; H01L 24/17; H01L 23/562; H01L 24/03; H01L 23/3157; H01L 21/31; H01L 23/3107; H01L 23/3114; H01L 2224/05022; H01L 2224/05009; H01L 2224/05008; H01L 2224/0401; H01L 2224/05569; H01L 2224/1134; H01L 2224/10126; H01L 2224/13022; H01L 2224/13021; H01L 2224/1191; H01L 2224/73203; H01L 2224/73204; H01L 24/02

See application file for complete search history.

(56) References Cited

U.S. PATENT DOCUMENTS 5,859,474 A * 1/1999 Dordi ............................ 257/737
6,103,552 A * 8/2000 Lin ........................... H01L 24/03
                                                                257/E21.508

(Continued)

*Primary Examiner* — Yu Chen
*Assistant Examiner* — Pauline Vu
(74) *Attorney, Agent, or Firm* — WPAT, P.C., Intellectual Property Attorneys; Anthony King

(57) ABSTRACT

A semiconductor structure includes an oval-shaped pad and a dielectric layer. The oval-shaped pad is on a substrate and includes a major axis corresponding to the largest distance of the oval-shaped pad. The major axis is toward a geometric center of the substrate. The dielectric layer covers the substrate and surrounds the oval-shaped pad.

14 Claims, 20 Drawing Sheets

(52) U.S. Cl.
CPC ............... *H01L 2224/05139* (2013.01); *H01L 2224/05144* (2013.01); *H01L 2224/05147* (2013.01); *H01L 2224/05555* (2013.01); *H01L 2224/05559* (2013.01); *H01L 2224/05569* (2013.01); *H01L 2224/05572* (2013.01); *H01L 2224/05573* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/0615* (2013.01); *H01L 2224/06051* (2013.01); *H01L 2224/06154* (2013.01); *H01L 2224/10126* (2013.01); *H01L 2224/1134* (2013.01); *H01L 2224/1191* (2013.01); *H01L 2224/11334* (2013.01); *H01L 2224/131* (2013.01); *H01L 2224/13021* (2013.01); *H01L 2224/13022* (2013.01); *H01L 2224/13111* (2013.01); *H01L 2224/13113* (2013.01); *H01L 2224/13118* (2013.01); *H01L 2224/13139* (2013.01); *H01L 2224/13144* (2013.01); *H01L 2224/13147* (2013.01); *H01L 2224/73203* (2013.01); *H01L 2924/01322* (2013.01); *H01L 2924/12042* (2013.01); *H01L 2924/3512* (2013.01)

(56) References Cited

U.S. PATENT DOCUMENTS

| | | | |
|---|---|---|---|
| 6,187,615 B1* | 2/2001 | Kim | H01L 23/3114 257/737 |
| 6,479,900 B1* | 11/2002 | Shinogi | H01L 23/3114 257/738 |
| 6,906,418 B2* | 6/2005 | Hiatt | H01L 21/6836 257/738 |
| 6,927,489 B1* | 8/2005 | Yaguchi | H01L 23/3114 257/690 |
| 7,122,459 B2* | 10/2006 | Feng | H01L 24/11 257/E21.508 |
| 8,030,767 B2* | 10/2011 | Yang | H01L 24/03 257/737 |
| 8,575,493 B1* | 11/2013 | Xu et al. | 174/255 |
| 8,946,891 B1* | 2/2015 | Nangalia | H01L 24/11 257/737 |
| 2001/0026021 A1* | 10/2001 | Honda | H01L 24/11 257/778 |
| 2002/0003259 A1* | 1/2002 | Maeda | H01L 23/556 257/347 |
| 2002/0043723 A1* | 4/2002 | Shimizu | H01L 23/528 257/758 |
| 2002/0056741 A1* | 5/2002 | Shieh | B23K 20/004 228/180.5 |
| 2002/0064935 A1* | 5/2002 | Honda | H01L 23/3114 438/622 |
| 2003/0008535 A1* | 1/2003 | Sakamoto et al. | 439/66 |
| 2003/0160335 A1* | 8/2003 | Tong | H01L 23/3114 257/778 |
| 2004/0113283 A1* | 6/2004 | Farnworth | H01L 21/3043 257/782 |
| 2004/0188819 A1* | 9/2004 | Farnworth et al. | 257/686 |
| 2004/0212054 A1* | 10/2004 | Maxwell et al. | 257/678 |
| 2004/0238926 A1* | 12/2004 | Obinata | H01L 21/78 257/678 |
| 2005/0064624 A1* | 3/2005 | Murakami | H01L 23/3192 438/106 |
| 2005/0139981 A1* | 6/2005 | Kobayashi | H01L 23/3114 257/690 |
| 2005/0140027 A1* | 6/2005 | Fan | H01L 24/02 257/779 |
| 2005/0167799 A1* | 8/2005 | Doan | H01L 21/568 257/678 |
| 2005/0245066 A1* | 11/2005 | Mis | 438/618 |
| 2006/0223340 A1* | 10/2006 | Yoneda | H01L 21/67294 438/800 |
| 2007/0164279 A1* | 7/2007 | Lin | H01L 22/32 257/48 |
| 2008/0001290 A1* | 1/2008 | Chou | H01L 23/53238 257/751 |
| 2008/0076207 A1* | 3/2008 | Yamano | H01L 21/561 438/108 |
| 2008/0093749 A1* | 4/2008 | Gerber | H01L 23/49816 257/784 |
| 2009/0289364 A1* | 11/2009 | Sakamoto | H01L 23/3114 257/738 |
| 2010/0120227 A1* | 5/2010 | Grivna | H01L 21/78 438/462 |
| 2010/0148812 A1* | 6/2010 | Nagai et al. | 324/754 |
| 2011/0027987 A1* | 2/2011 | Takahashi | C23C 18/1632 438/652 |
| 2011/0089562 A1* | 4/2011 | Watanabe | H01L 23/3114 257/737 |
| 2011/0101527 A1* | 5/2011 | Cheng et al. | 257/738 |
| 2011/0193220 A1* | 8/2011 | Kuo | H01L 24/11 257/737 |
| 2011/0254151 A1* | 10/2011 | Lin et al. | 257/737 |
| 2011/0273856 A1* | 11/2011 | Nawata | 361/767 |
| 2011/0285006 A1* | 11/2011 | Weng | H01L 23/13 257/686 |
| 2011/0309490 A1* | 12/2011 | Lu et al. | 257/737 |
| 2012/0146212 A1* | 6/2012 | Daubenspeck | H01L 24/03 257/737 |
| 2013/0093079 A1* | 4/2013 | Tu et al. | 257/737 |
| 2015/0061079 A1* | 3/2015 | Chen | H01L 21/78 257/620 |

* cited by examiner

US 10,163,828 B2

SEMICONDUCTOR DEVICE AND FABRICATING METHOD THEREOF

FIELD

The disclosure relates to a semiconductor device and a fabricating method thereof.

BACKGROUND

Chip scale packages (CSP) are widely adopted for semiconductor chip assemblies in the industry since the component has a smaller size. Wafer-level chip-scale packages (WLCSP) are considered a popular type of CSP. The use of wafer-level chip-scale packages employs a method in which the pads may be etched or printed directly onto the silicon wafer, resulting in the package being very close to the size of the silicon dies. A semiconductor device made with a WLCSP usually has a smaller size and no bonding wires at all.

When using wafer-level chip-scale packages, a common issue involves a mismatch in the coefficient of thermal expansion (CTE) between multi-layers, dissimilar materials (e.g., between redistribution layer (RDL), solder ball, printed circuit board (PCB)), and associated insulating layers. The CTE mismatch creates high stress during a reliability test, which leads to premature fatigue or cracking in the solder ball. Thus, a package structure or a method for reducing the mismatch in the CTE is still in great demand.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION OF THE INVENTION

Figure 1:
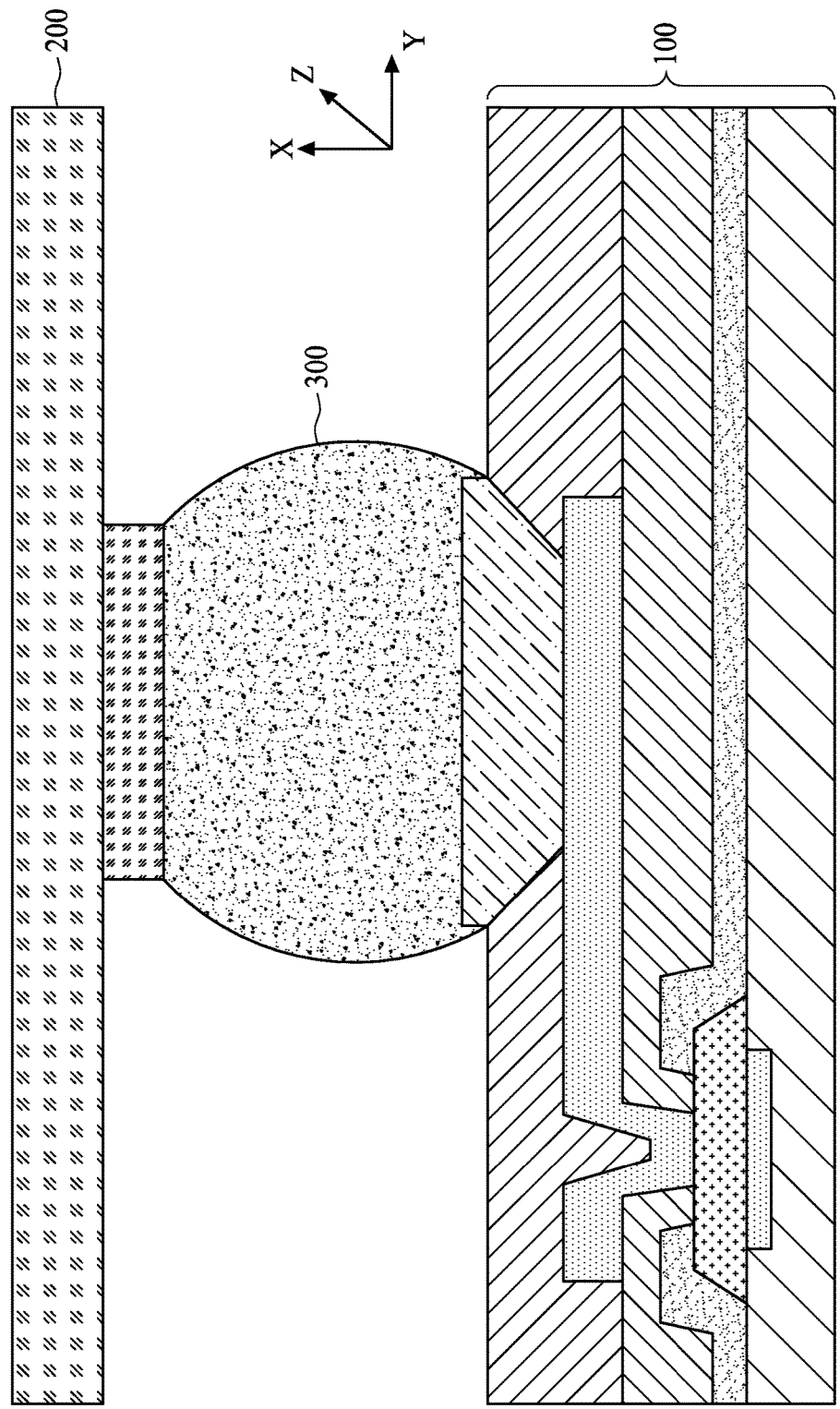
FIG. 1 is a cross-sectional view of a semiconductor conductor component with a circuit board, a semiconductor device and a solder bump according to some embodiments of the present disclosure.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

A semiconductor device is mounted on a circuit board via several solder bumps disposed therebetween. In the present disclosure, a metal bump has a top flat surface, which is used to receive the solder bump. The metal bump is disposed in the semiconductor device and shaped to extend a contact distance between the solder bump and the circuit board. Since the top flat surface of the metal bump includes a major axis corresponding to the largest distance of the metal bump, the solder bump formed on the metal bump also has an axis along the major axis. The axis of the solder bump is designed along an expanding direction of the circuit board so as to prevent the solder bump from completely cracking due to CTE mismatch.

In various embodiments, a polymer layer is compliant to the morphology of the semiconductor device and acts as a buffer between the semiconductor device and the circuit. The polymer layer has a CTE approximating the CTE of the circuit board and therefore is used to reduce CTE mismatch between the semiconductor device and the circuit board so as to avoid cracking in the solder bump therebetween.

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which are interconnected through an interconnect layer to additional integrated circuits. In some embodiments, the bulk substrate includes a wafer such as a polished wafer, an epi wafer, an argon anneal wafer, a hai wafer and a silicon on insulator (SOI) wafer.

As used herein, a "semiconductor device" refers to a chip carrier, which is generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation. Active electrical components, such as transistors, have the ability to control the flow of electrical current. Passive electrical components, such as capacitors, inductors, resistors, and transformers, create a relationship between voltage and current necessary to perform electrical circuit functions.

As used herein, "active and passive components" refers to components, which are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers are formed by a variety of deposition techniques determined in part by the type of material being deposited. For example, thin film deposition involves chemical vapor deposition (CVD), physical vapor deposition (PVD), electrolytic plating, and electroless plating processes. Each layer is generally patterned to form portions of active components, passive components, or electrical connections between components. The layers are patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

As used herein, "back-end manufacturing" refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual dies are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Referring to FIG. 1, a semiconductor conductor component 10 has a circuit board 200, which is mounted on a semiconductor device 100. The semiconductor device 100 is connected with the circuit board 200 via a solder bump 300. In some embodiments, the circuit board 200 provides a general substrate for structural support and electrically connects with the semiconductor device 100. Conductive signal traces (not shown in the drawing) are formed on a surface or within layers of the circuit board 200 using evaporation, electrolytic plating, electroless plating, screen printing, physical vapor deposition (PVD), or some other suitable metal deposition processes. In other embodiments, the circuit board 200 is a printed circuit board.

In some embodiments, the semiconductor device 100 is a die carrier substrate with several semiconductor packages mounted on its surface, depending on the application. For instance, the semiconductor packages are microprocessors, memories, application specific integrated circuits (ASIC), logic circuits, analog circuits, RF circuits, discrete devices, or other semiconductor dies or electrical components.

In some embodiments, the semiconductor device 100 has two packaging levels. First level packaging is a technique for mechanically and electrically attaching a semiconductor die to a holder. Second level packaging involves mechanically and electrically attaching the holder to the circuit board 200. In other embodiments, a semiconductor device 100 only has the first level packaging where the semiconductor die is mechanically and electrically mounted directly to the circuit board 200. In still other embodiments, several types of first level packaging include a wire bond package and a flip chip, while several types of second level packaging include a ball grid array (BGA), a bump chip carrier (BCC), a dual in-line package (DIP), a land grid array (LGA), a multi-chip module (MCM), a quad flat non-leaded package (QFN) and a quad flat package. Depending upon the system requirements, any combination of semiconductor packages, configured with any combination of first and second level packaging styles, as well as other electronic components, is connected to the circuit board 200.

The solder bump 300 has solder material which is of any metal or electrically conductive material, e.g., Sn, lead (Pb), Au, Ag, Cu, zinc (Zn), bismuthinite (Bi), and alloys thereof, with an optional flux material. For example, the solder material is eutectic Sn/Pb, high-lead, or lead-free.

Figure 2:
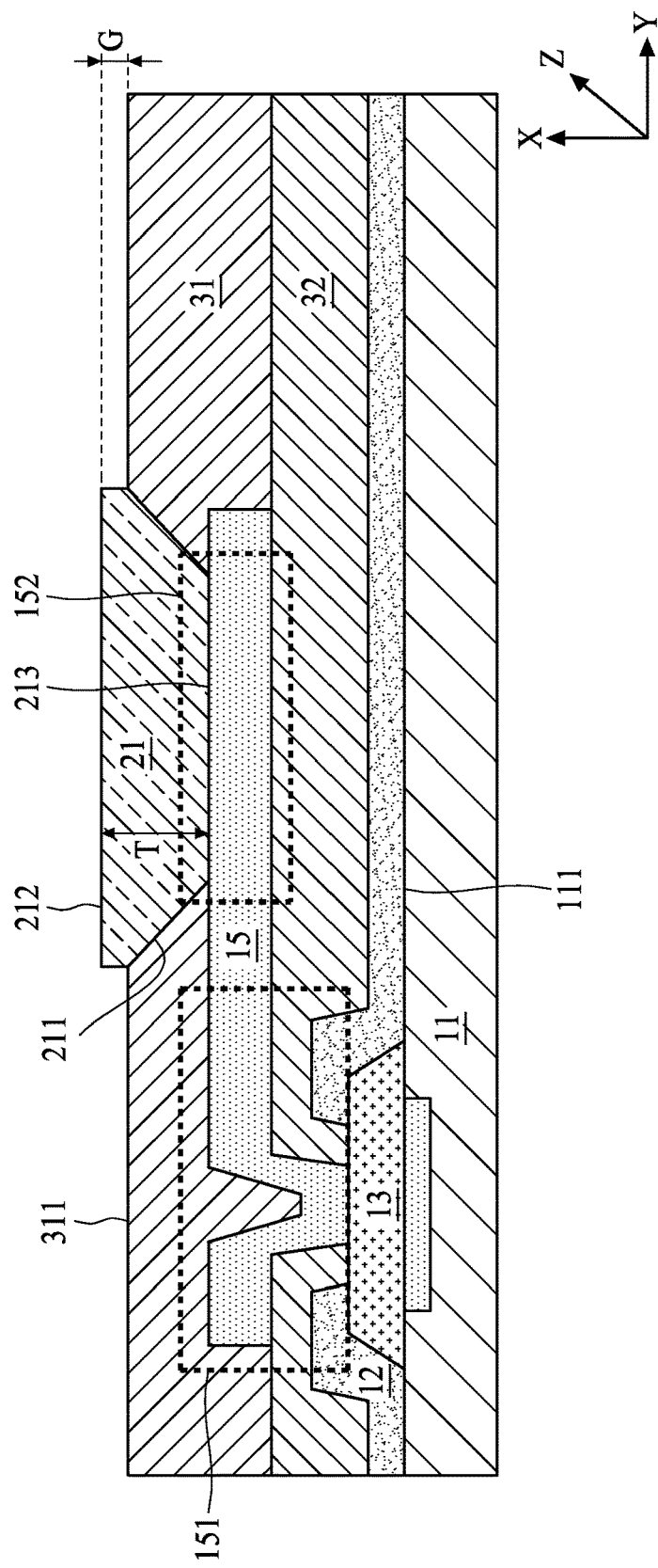
FIG. 2 is a cross-sectional view of a semiconductor device with a metal bump configured to receive the solder bump according to some embodiments of the present disclosure.

FIG. 2, a cross-sectional view of a semiconductor device 100 having several components. In some embodiments, a pad 13 is disposed on a substrate 11. A passivation layer 12 is disposed on the substrate 11 and a sidewall of the pad 13. An insulation layer 32 covers the passivation layer 12 and a portion of the pad 13. A conductive layer 15 is disposed above the pad 13 and contacts with the pad 13. A metal bump 21 is disposed on the conductive layer 15. A dielectric layer 31 covers the conductive layer 15 and surrounds the metal bump 21.

In some embodiments, the substrate 11 is made with a semiconductor base material such as germanium, gallium arsenide, indium phosphide, or silicon carbide. In other embodiments, several semiconductor dies are formed on the substrate 11 using the semiconductor manufacturing processes described above. Each semiconductor die has active and passive devices, integrated passive devices (IPD), conductive layers, and dielectric layers formed on an active surface 111 according to the electrical design of the die. In still other embodiments, the semiconductor die contains baseband digital circuits, such as a digital signal processor (DSP), a memory, or some other signal processing circuit. The semiconductor die also contains IPD, such as inductors, capacitors, and resistor, for radio frequency (RF) signal processing.

In some embodiments, the pad 13 is patterned and deposited over the substrate 11. The pad 13 is made with a conductive material, such as aluminum (Al), copper (Cu), tin (Sn), nickel (Ni), gold (Au), silver (Ag), or some other suitable electrically conductive material. The pad 13 is used as a contact pad having an electrical connection to the active and passive devices, IPDs, and other conductive layers disposed in the active surface 111.

In some embodiments, the passivaiton layer 12 is formed over the substrate 11 and the pad 13. The passivation layer 12 is made with a dielectric material, such as silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), polyimide, benzocyclobutene (BCB), polybenzoxazoles (PBO), or some other material having suitable insulating properties for a single layer. In other embodiments, the passivation layer 12 is a stack with multiple layers.

In some embodiments, the insulation layer 32 is conformally applied over the passivation layer 12. The insulation layer 32 is made with a dielectric material, such as silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), polyimide, benzocyclobutene (BCB), polybenzoxazoles (PBO), epoxy, polyimide, or some other material having suitable insulating properties for a single layer. In other embodiments, the insulation layer 32 is a stack with multiple layers. In still other embodiments, the insulation layer 32 is parylene or fluorinated polymers applied using a low-temperature deposition in the range of 25-60° C.

In some embodiments, the conductive layer 15 is patterned and deposited over the insulation layer 32 and the pad 13. Particularly, the conductive layer 15 is electrically coupled to the pad 13 at one end of a portion 151 of the conductive layer 15. The conductive layer 15 is made with a conductive material, such as Al, Cu, Sn, Ni, Au, Ag, or some other suitable electrically conductive material. In certain embodiments, the conductive layer 15 is used as a runner or redistribution layer (RDL) to extend the interconnectivity of the pad 13.

In some embodiments, the metal bump 21 is patterned and deposited over a portion 152 of the conductive layer 15. The metal bump 21 is made with a conductive material, such as Al, Cu, Sn, Ni, Au, Ag, Pb, or some other suitable electrically conductive material. In some embodiments, the metal bump 21 is also a bump pad for the conductive layer 15 and electrically coupled to the pad 13 via the conductive layer 15. Particularly, the metal bump 21 has a bottom surface 213, which contacts with the portion 152 of the conductive layer 15 for electrical communication.

In other embodiments, the metal bump 21 is a single metal protrusion, which includes a top surface 212 and a sidewall 211. The sidewall 211 is tapered and attached to the dielectric layer 31, which protects the conductive layer 15 from humidity. Alternatively, the sidewall 211 vertically extends along a normal direction (X axis) of the substrate 11 and is surrounded by the dielectric layer 31. Since the metal bump 21 is used like an under bump metallization layer (UBM), which is configured to receive the solder bump 300 (referring to FIG. 1), the top surface 212 is used to receive the solder bump 300. In certain embodiments, an intermetallic layer is formed between the solder bump 300 and the metal bump 21 and used to inhibit the electromigration of the conductive layer 15.

In still other embodiments, the metal bump 21 is a multi-metal stack with an adhesion layer, a barrier layer, and a seed or wetting layer. The adhesion layer is formed over the conductive layer 15 and is made of Ti, TiN, TiW, Al, or Cr. The barrier layer is formed over the adhesion layer and is made of Ni, NiV, platinum Pt, Pd, TiW, or CrCu. The barrier layer inhibits the diffusion of Cu into the active area of the die. The seed layer is made of Cu, Ni, NiV, Au, or Al. The seed layer is formed over the barrier layer and acts as an intermediate conductive layer between the conductive layer 15 and subsequent solder bump 300 or some other interconnect structure. The metal bump 21 provides a low resistive interconnect to the conductive layer 15, as well as a barrier for solder diffusion and the seed layer for solder wettability.

In some embodiments, the dielectric layer 31 is conformally applied over the insulation layer 32 and the conductive layer 15. The dielectric layer 31 is made with a dielectric material, such as silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), polyimide, benzocyclobutene (BCB), polybenzoxazoles (PBO), epoxy, polyimide, or some other material having suitable insulating properties for a single layer. In other embodiments, the dielectric layer 31 is a stack with multiple layers. In still other embodiments, the dielectric layer 31 is parylene or fluorinated polymers applied using a low temperature deposition, e.g., in the range of 25-60° C. In certain embodiments, the dielectric layer 31 and the insulation layer 32 integrate into a single layer.

In other embodiments, the dielectric layer 31 surrounds the sidewall 211 of the metal bump 21 and has a top surface 311. In this case, the top surface 212 of the metal bump 21 is leveled to be above the top surface 311 of the dielectric layer 31. In other words, the metal bump 21 is leveled to be above the dielectric layer 31. Alternatively, the top surface 212 is leveled to be the same with or under the top surface 311. In some embodiments as shown in FIG. 2, the metal bump 21 is leveled to be above the top surface 311 with a gap G between about 1 µm and about 3 µm. In certain embodiments, the gap G is between about 1 µm and about 6 µm. In some other embodiments, the gap G is between about 1 µm and about 4 µm. In still other embodiments, the gap G is between about 2 µm and about 3 µm.

The gap G is adjustable according to a thickness T of the metal bump 21. In some embodiments, the thickness T is between about 8 µm and about 12 µm. In certain embodiments, the thickness T is between about 6 µm and about 13 µm. In other embodiments, the thickness T is between about 1 µm and about 17 µm. In some other embodiments, the thickness T is between about 4 µm and about 25 µm.

Figure 3:
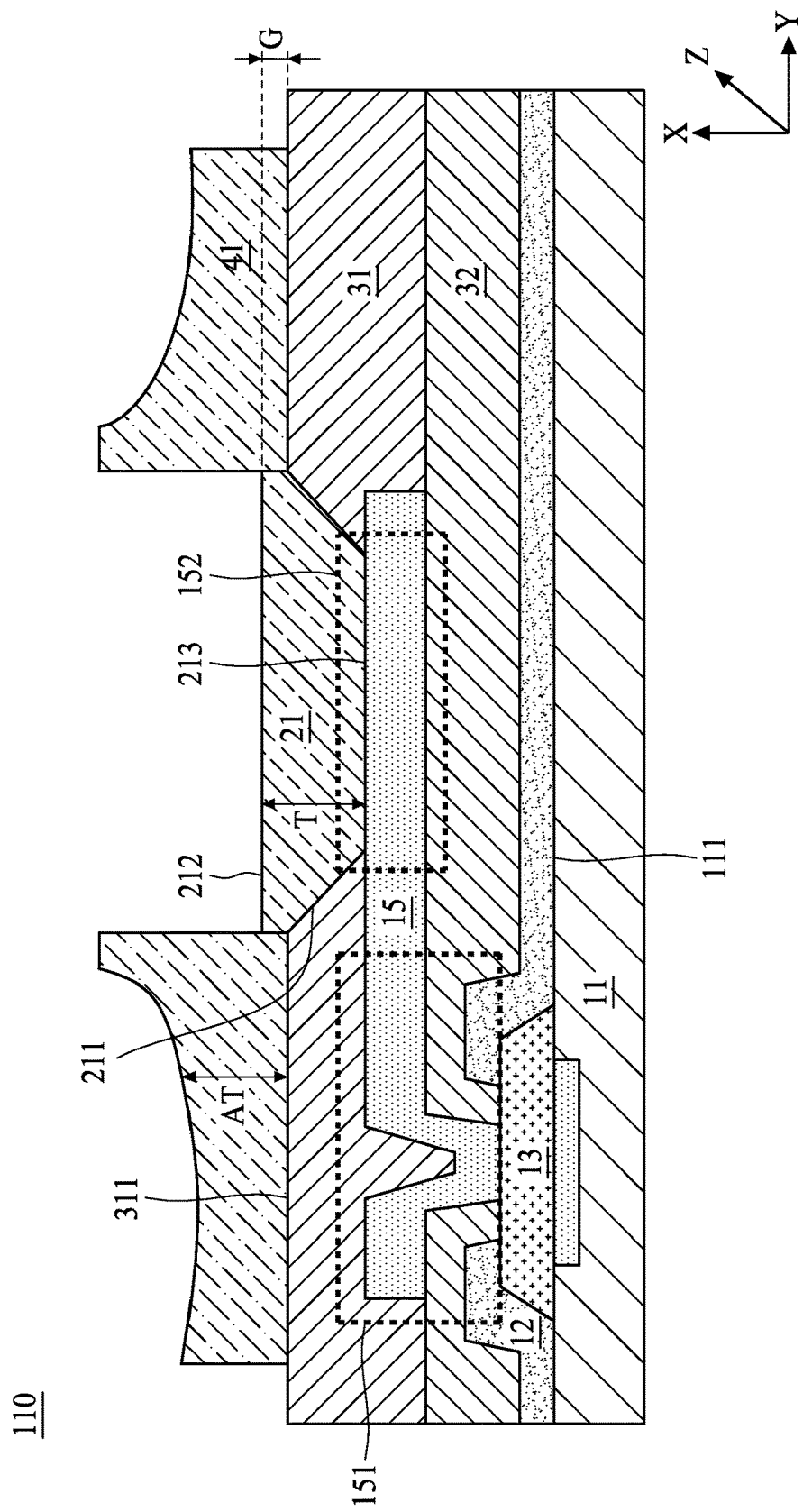
FIG. 3 is a cross-sectional view of a semiconductor device with a polymer layer attached atop the semiconductor device according to some embodiments of the present disclosure.

In some embodiments as shown in FIG. 3, a semiconductor device 110 includes a polymer layer 41 on the top surface 311 of the dielectric layer 31. The polymer layer 41 is made with a dielectric material, such as silicon dioxide ($SiO_2$), silicon nitride ($Si_3N_4$), silicon oxynitride (SiON), tantalum pentoxide ($Ta_2O_5$), zircon ($ZrO_2$), aluminum oxide ($Al_2O_3$), polyimide, benzocyclobutene (BCB), polybenzoxazoles (PBO), epoxy, polyimide, or some other material having suitable insulating properties for a single layer. Since the polymer layer 41 has a CTE greater than a CTE of the dielectric layer 31, the total CTE of the semiconductor device 110 raises so as to reduce the CTE mismatch between the semiconductor device 110 and the circuit board 200 (refer to FIG. 1).

The effective CTE of the semiconductor device 110 is adjustable according to an average thickness AT of the polymer layer 41. In some embodiments, the average thickness AT is between about 20 µm and about 50 µm. In certain embodiments, the average thickness AT is between about 26 µm and about 65 µm. In other embodiments, the average thickness AT is between about 31 µm and about 77 µm. In some other embodiments, the average thickness AT is between about 41 µm and about 82 µm. In some embodiments, the thickness of the dielectric layer 31 is hardly adjusted according to different designs, and thus the average thickness AT of the polymer 41 is adjusted to reduce the above-mentioned CTE mismatch.

In other embodiments, the dielectric layer 31 has a thickness between about 7.5 µm and about 10 µm. In other words, the average thickness AT of the polymer 41 is greater than the thickness of the dielectric layer 31.

Figure 4:
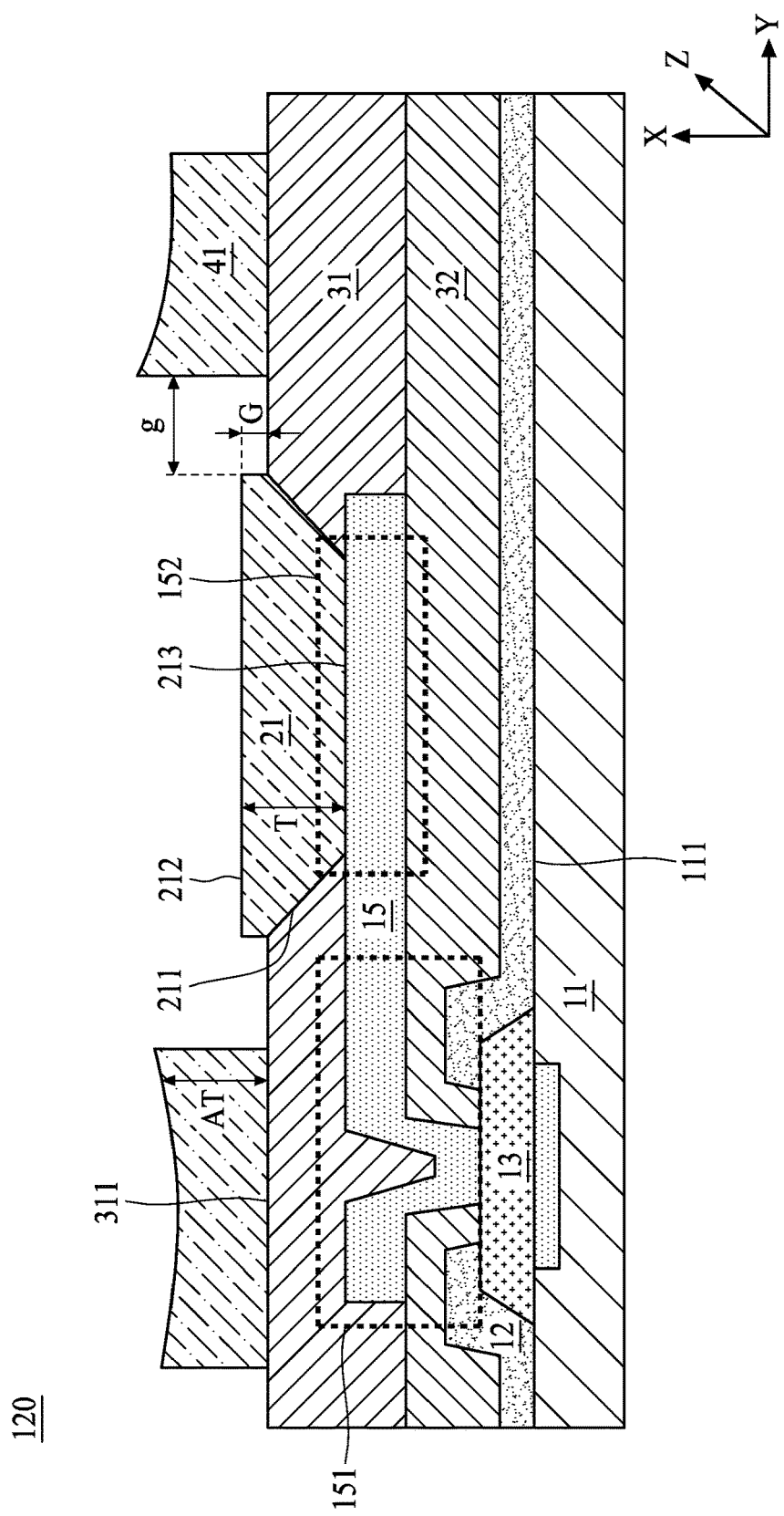
FIG. 4 is a cross-sectional view of a semiconductor device with a polymer layer where a portion of which is removed by an etching process according to some embodiments of the present disclosure.

In some embodiments as shown in FIG. 3, the polymer layer 41 surrounds the sidewall 211 of the metal bump 21. In other words, the top surface 212 is exposed by the polymer layer 41 and configured to receive the solder bump. Alternatively, in the semiconductor device 120 as shown in FIG. 4, the polymer layer 41 is spaced from the sidewall 211 of the metal bump 21 with a gap g, which is between about 45 µm and about 75 µm. In certain embodiments, the gap g is between about 39 µm and about 80 µm. In other embodiments, the gap g is between about 31 µm and about 95 µm. In some other embodiments, the gap g is between about 58 µm and about 68 µm.

Figure 5:
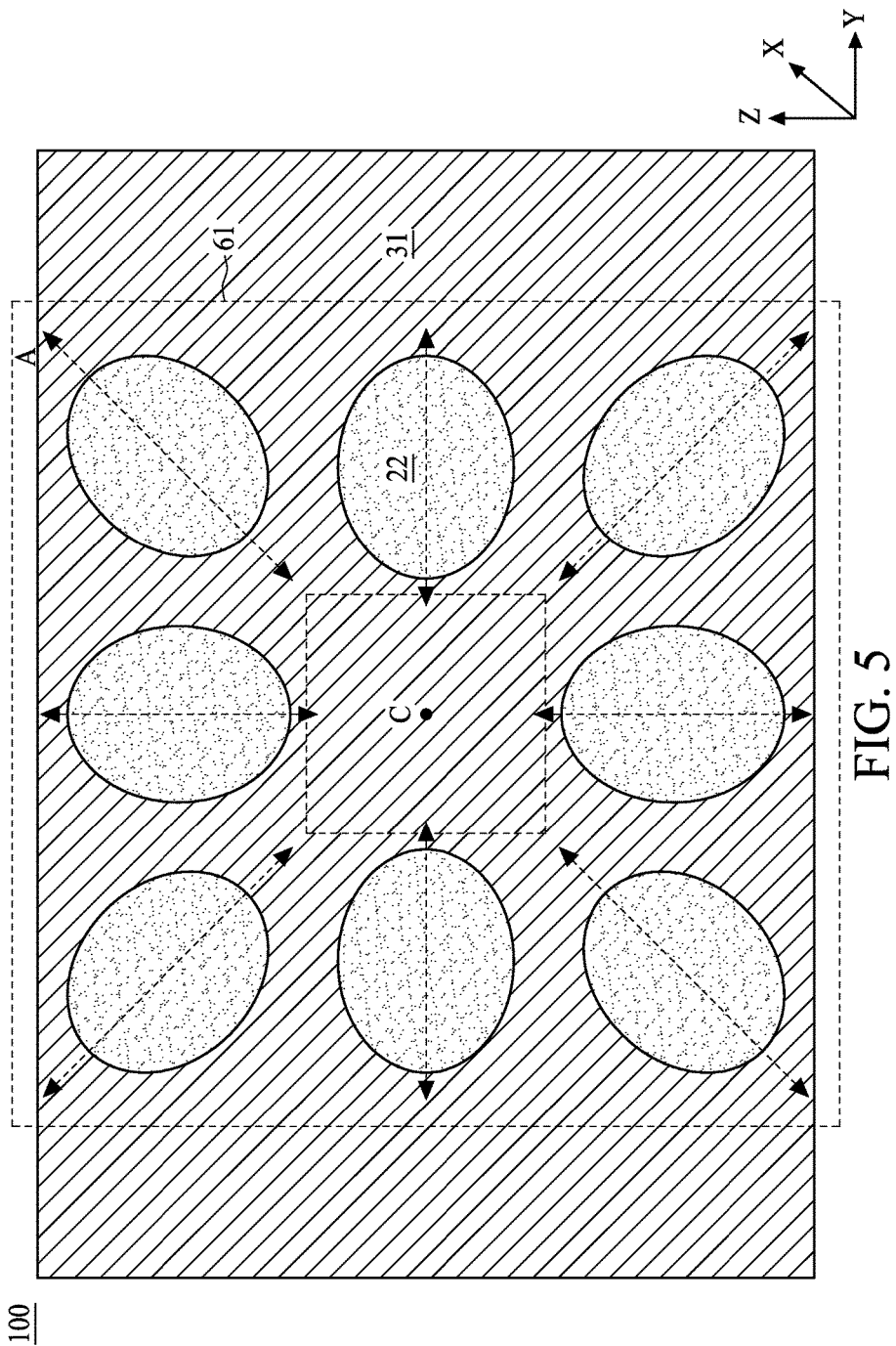
FIG. 5 is a top view of a portion of the semiconductor device as shown in FIG. 2 according to some embodiments of the present disclosure.

FIG. 5 is a top view of a portion of the semiconductor device 100 in FIG. 2, and elements with same labeling numbers as those in FIG. 2 are previously discussed with reference thereto and are not repeated here for simplicity. In FIG. 5, the semiconductor device 100 includes at least one oval-shaped pad 22, which is a top view of the metal bump 21 in FIG. 2, and the dielectric layer 31 surrounding the oval-shaped pad 22. The oval-shaped pad 22 is disposed on a carrier or the substrate 11 (referring to FIG. 2).

The oval-shaped pad 22 includes a major axis A, which is corresponding to the largest distance of the oval-shaped pad 22. The major axis A is toward a geometric center C of the carrier or the substrate 11 that is covered by several proceeding coverage materials such as the dielectric layer 31. In some embodiments, the oval-shaped pad 22 is located on a peripheral region 61 of the carrier or the substrate 11. Alternatively, the oval-shaped pad 22 is located near the geometric center C of the carrier or the substrate 11.

Figure 6:
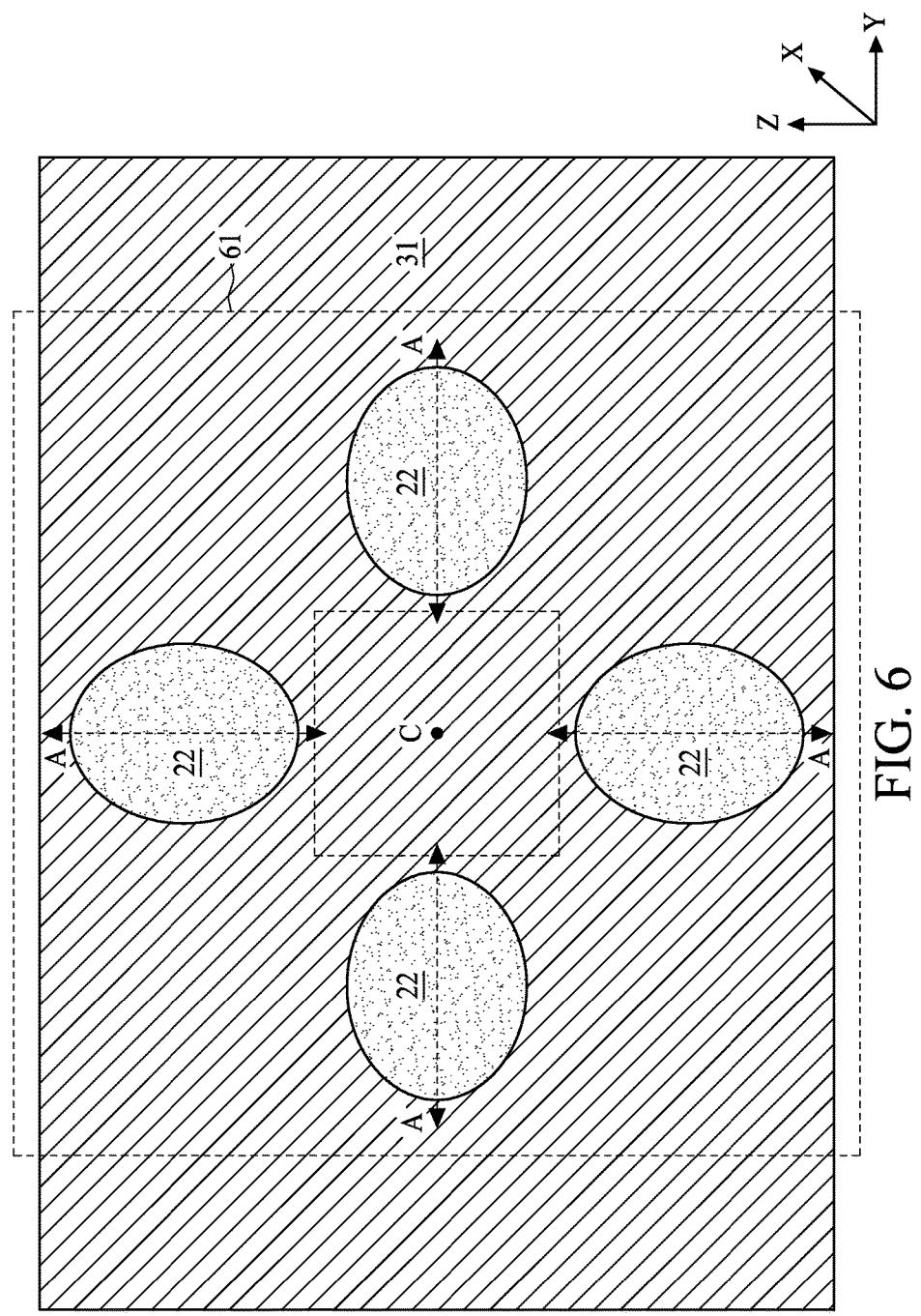
FIG. 6 is a top view of a semiconductor device according to some embodiments of the present disclosure.
Figure 7:
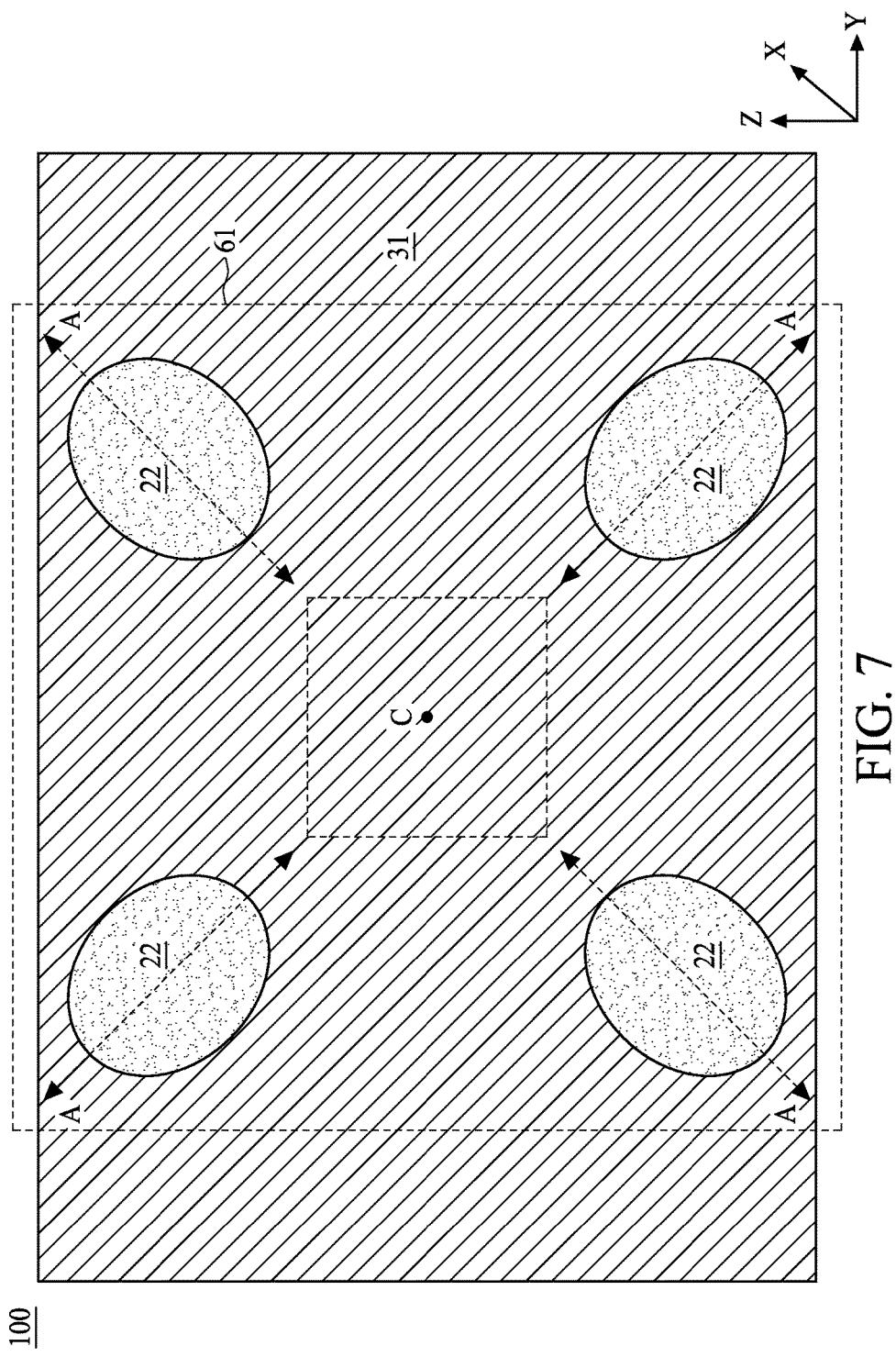
FIG. 7 is a top view of a semiconductor device according to some embodiments of the present disclosure.
Figure 8:
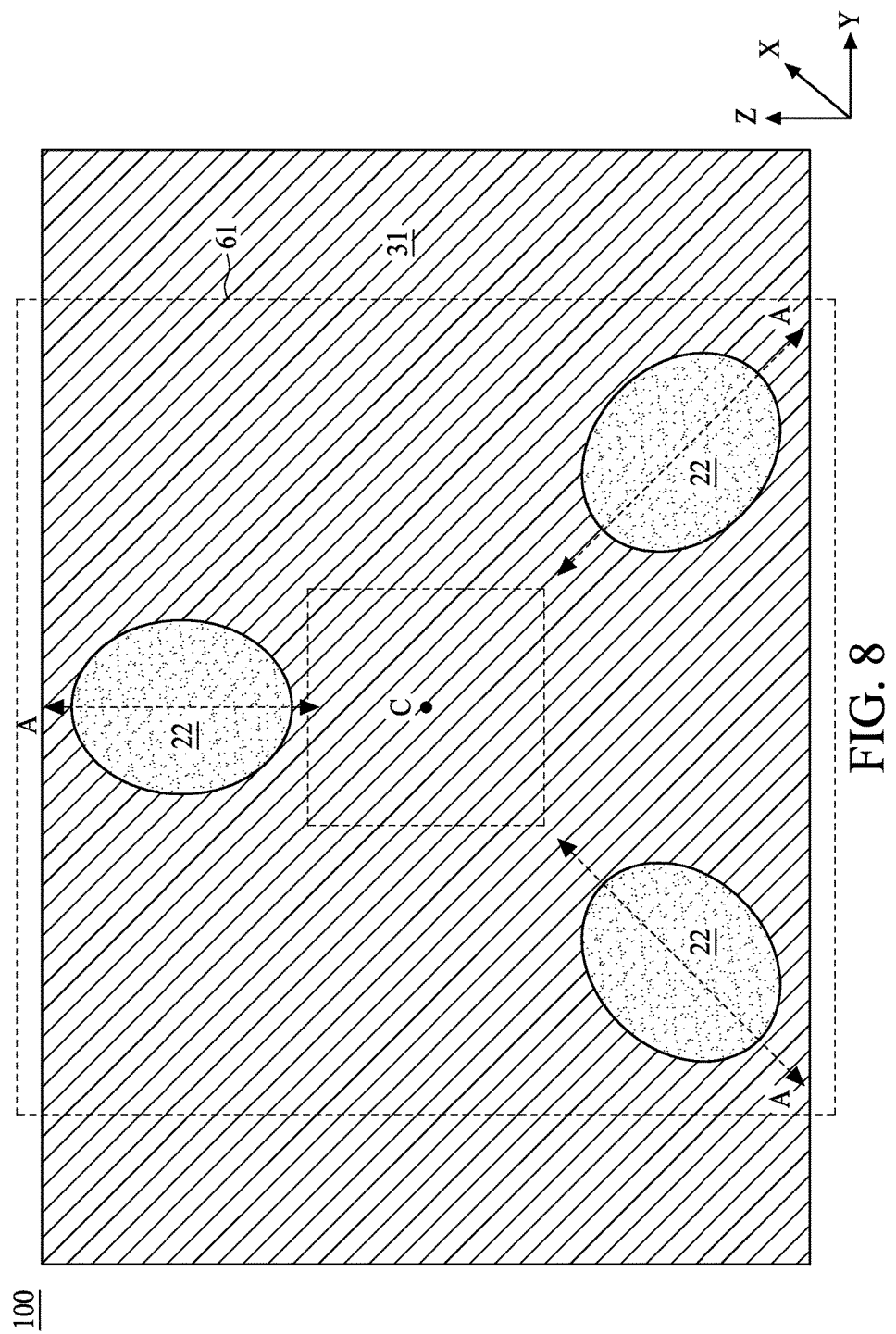
FIG. 8 is a top view of a semiconductor device according to some embodiments of the present disclosure.

In some embodiments as shown in FIGS. 6 to 8, the semiconductor device 100 further includes several oval-shaped pads 22 disposed symmetrically to the geometric center C of the carrier or the substrate 11 that is covered by several proceeding coverage materials such as the dielectric layer 31. These oval-shaped pads 22 are arranged in accordance with the underlying pad pattern, such as a rhombus pattern as shown in FIG. 6, a rectangle pattern as shown in FIG. 7, a triangle pattern as shown in FIG. 8, and a combination pattern thereof.

Figure 9:
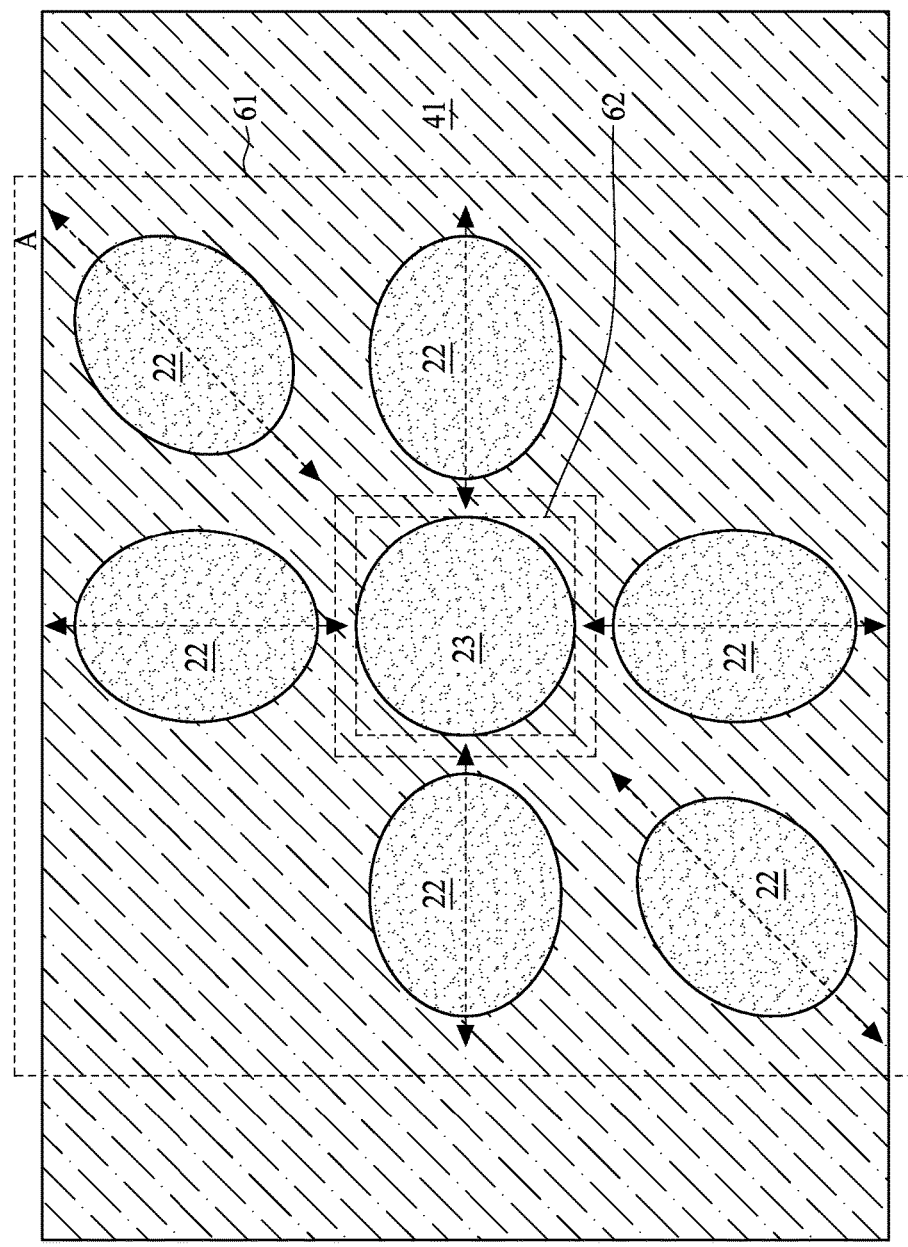
FIG. 9 is a top view of a semiconductor device with the polymer layer surrounding the metal bump according to some embodiments of the present disclosure.

FIG. 9 is a top view of a portion of the semiconductor device 110 in FIG. 3, and elements with same labeling numbers as those in FIG. 3 are previously discussed with reference thereto and are not repeated here for simplicity. In FIG. 9, the semiconductor device 110 includes several oval-shaped pads 22, which is a top view of the metal bump 21 in FIG. 3, and the polymer layer 41 surrounding the oval-shaped pad 22. The polymer layer 41 covers the dielectric layer.

In some embodiments, the semiconductor device 110 further includes a non oval-shaped pad 23, which is located at a central region 62 of the carrier or the substrate 11 that is covered by several proceeding coverage materials such as the polymer layer 41. The oval-shaped pad 22 has a same top surface area as the non oval-shaped pad 23. Compared with the non oval-shaped pad 23, the oval-shaped pad 22 is able to increase the connection area with the circuit board along the major axis A, while solders are dropped on the oval-shaped pad 22 and the non oval-shaped pad 23. Thus, during reliability testing (−40° C. to 125° C.), the oval-shaped pad 22 is able to enhance the reliability because the cracking that occurs in the solder bump hardly disconnects the semiconductor device 110 and the circuit board along the major axis A.

Figure 10:
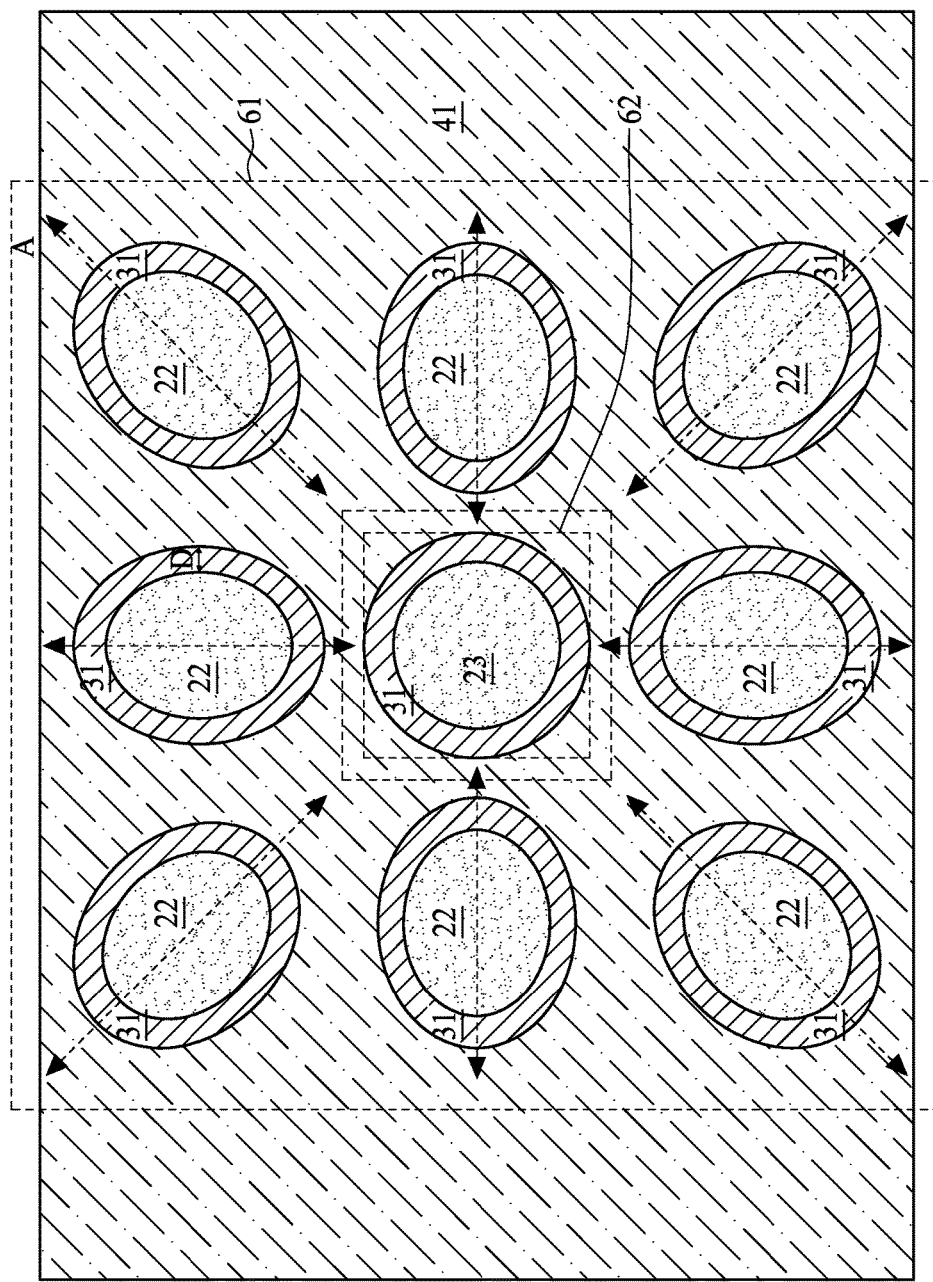
FIG. 10 is a top view of a semiconductor device with the polymer layer spaced from the metal bump with a gap according to some embodiments of the present disclosure.

In certain embodiments as shown in FIG. 10, the semiconductor device 120 further includes a gap D between the polymer layer 41 and the oval-shaped pad 22 or the non oval-shaped pad 23. The gap D exposes the dielectric layer 31. In some embodiments, the gap g is between about 43 µm and about 77 µm. In certain embodiments, the gap D is between about 38 µm and about 83 µm. In other embodiments, the gap D is between about 29 µm and about 91 µm. In some other embodiments, the gap D is between about 55 µm and about 67 µm.

A method of fabricating a semiconductor device is used to prevent the solder bump from completely cracking due to CTE mismatch. The method includes a number of operations and the description and illustration are not deemed as a limitation as the order of the operations.

A term "providing" or "provided" is used in the present disclosure to describe an operation of locating an object to a specific site such as a chuck. The providing operation includes various steps and processes and varies in accordance with the features of embodiments. In some embodiments, a providing operation includes holding a semiconductor substrate or a wafer for further spinning motion. In certain embodiments, a providing operation includes spinning a semiconductor substrate or a wafer in a vacuum condition.

A term "disposing" or "disposed" is used in the present disclosure to describe an operation of locating an object on another object or a film. The disposing operation includes various steps and processes and varies in accordance with the features of embodiments. In some embodiments, a disposing operation includes depositing a portion of the object. For instance, the deposition involves chemical vapor deposition, physical vapor deposition, printing, spin coating, sintering, thermal oxidation, electrolytic plating, and electroless plating processes.

A term "forming" or "formed" is used in the present disclosure to describe an operation of applying a metal material on an object. The forming operation includes various steps and processes and varies in accordance with the features of embodiments. In some embodiments, the forming operation is a deposition operation, which deposits a conductive layer on the object. In other embodiments, the forming operation is an oxidizing operation in a furnace where the object is oxidized. In certain embodiments, the forming operation is an etching operation, which vertically remove a portion of the object by the external force.

A term "filling" or "filled" is used in the present disclosure to describe an operation of placing a material into a vacancy or a place. The filling operation includes various steps and processes and varies in accordance with the features of embodiments. In some embodiments, the filling operation includes depositing a metal material on a conductive trace. In some embodiments, the filling operation includes depositing the dielectric into a trench as an isolation structure. In certain embodiments, the filling operation includes epitaxially growing the dielectric in the trench.

Figure 11:
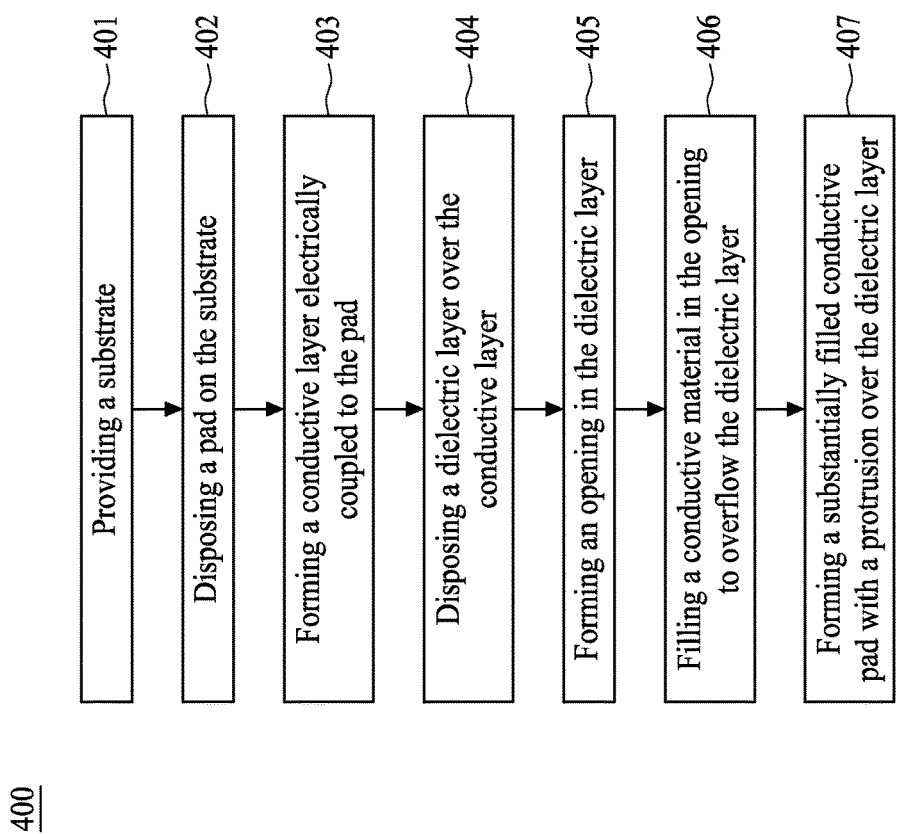
FIG. 11 is a flowchart of a method for fabricating a semiconductor device according to some embodiments of the present disclosure.

FIG. 11 is a diagram of a method 400 for fabricating a semiconductor structure in accordance with some embodiments of the present disclosure. The method 400 includes several operations, which are discussed in detail with reference to FIGS. 12 to 18. At operation 401, a substrate is provided. At operation 402, a pad is disposed on the substrate. At operation 403, a conductive layer is formed and electrically coupled to the pad. At operation 404, a dielectric layer is disposed over the conductive layer. At operation 405, an opening is formed in the dielectric layer thereby exposing a portion of the conductive layer. At operation 406, a conductive material is filled in the opening to overflow a top surface of the dielectric layer. At operation 407, a substantially filled conductive pad with a protrusion is formed over the top surface of the dielectric layer.

FIGS. 12 to 18 have been simplified for a better understanding of the inventive concepts of the present disclosure. In FIGS. 12 to 18, elements with same labeling numbers as those in FIGS. 1 to 10 are previously discussed with reference thereto and are not repeated here for simplicity.

Figure 12:
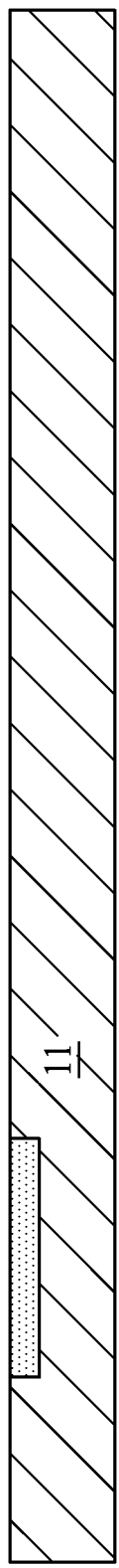
FIG. 12 is a cross-sectional view of a substrate according to some embodiments of the present disclosure.

Referring to FIG. 12, the substrate 11 or a wafer is provided. In some embodiments, the substrate 11 includes several dies, each of which has active and passive devices using semiconductor manufacturing processes described above.

Figure 13:
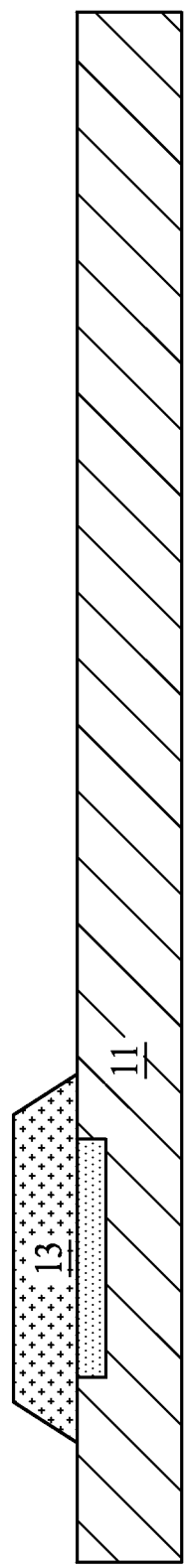
FIG. 13 is a cross-sectional view of a pad formed on the substrate according to some embodiments of the present disclosure.
Figure 14:
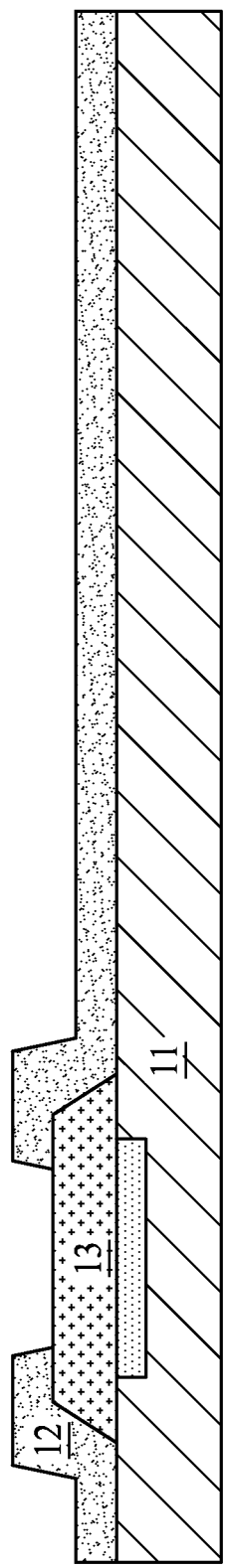
FIG. 14 is a cross-sectional view of a passivation layer formed on the pad according to some embodiments of the present disclosure.

Referring to FIG. 13, the pad 13 is formed or patterned on the substrate 11 through PVD, CVD, electrolytic plating or electroless plating processes. In some embodiments as shown in FIG. 14, after the pad 13 is attached on the top surface of the substrate 11, the passivation layer 12 is blanket deposited using PVD, CVD, printing, spin coating, sintering or thermal oxidation. A portion of the passivation layer 12 is removed by an etching process to expose the top surface of the pad 13.

Figure 15:
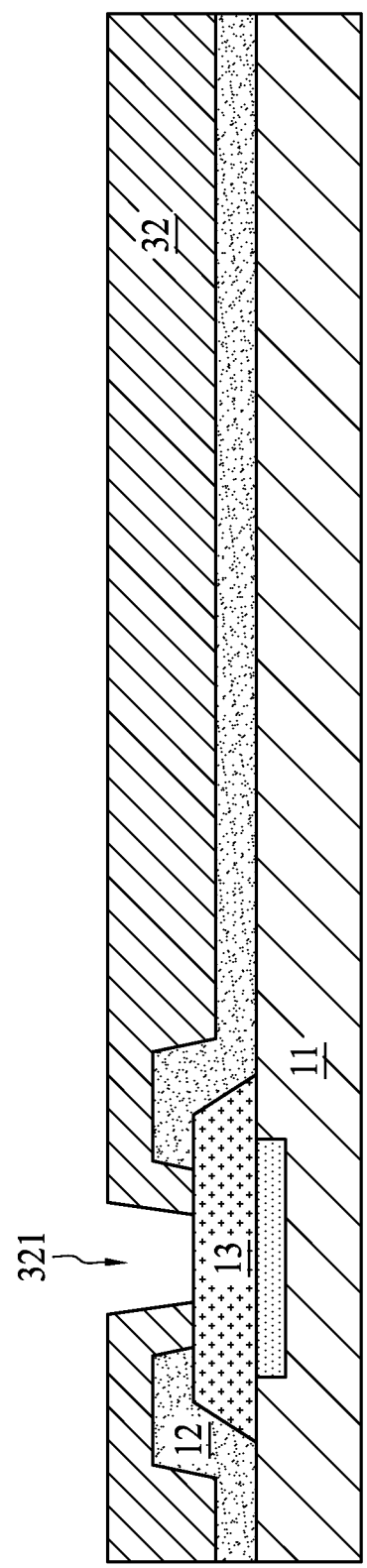
FIG. 15 is a cross-sectional view of an insulation layer formed on the passivation layer according to some embodiments of the present disclosure.

Referring to FIG. 15, the insulation layer 32 is compliant to the morphology of the passivation layer 12 through PVD, CVD, printing, spin coating, sintering or thermal oxidation. A portion of the insulation layer 32 is removed by an etching process to expose the top surface of the pad 13 and hence a hole 321 is formed in the insulation layer 32.

Figure 16:
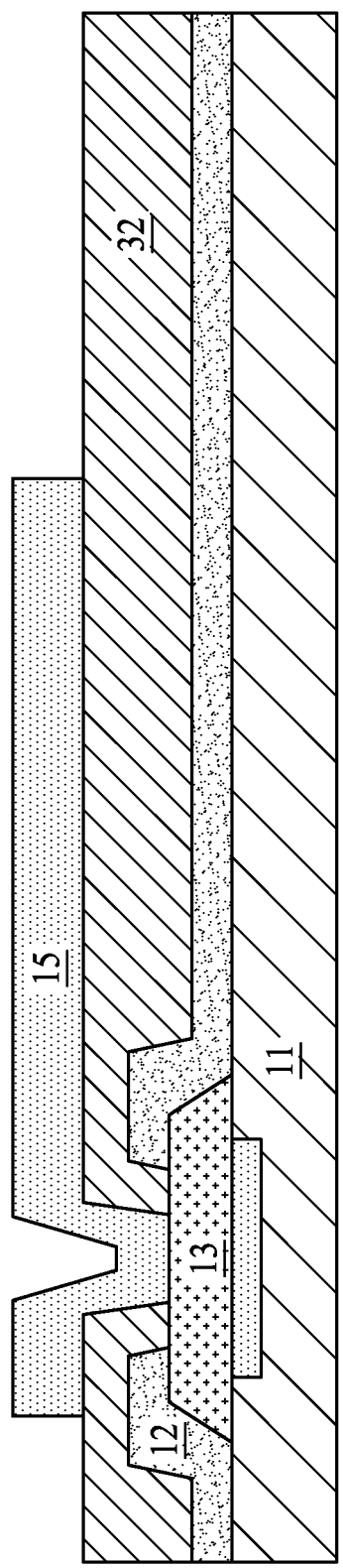
FIG. 16 is a cross-sectional view of a conductive layer formed on the insulation layer and contacting with the pad according to some embodiments of the present disclosure.

Referring to FIG. 16, the conductive layer 15 or a metal trace is patterned and deposited over the insulation layer 32 and contacts with the pad 13 through the hole 321. For electric signal communication, since the portion 151 of the conductive layer 15 is electrically coupled to the pad 13, the signal from the pad 13 is able to transfer to the conductive layer 15. The deposition of the conductive layer 15 uses PVD, CVD, electrolytic plating, or an electroless plating process.

Figure 17:
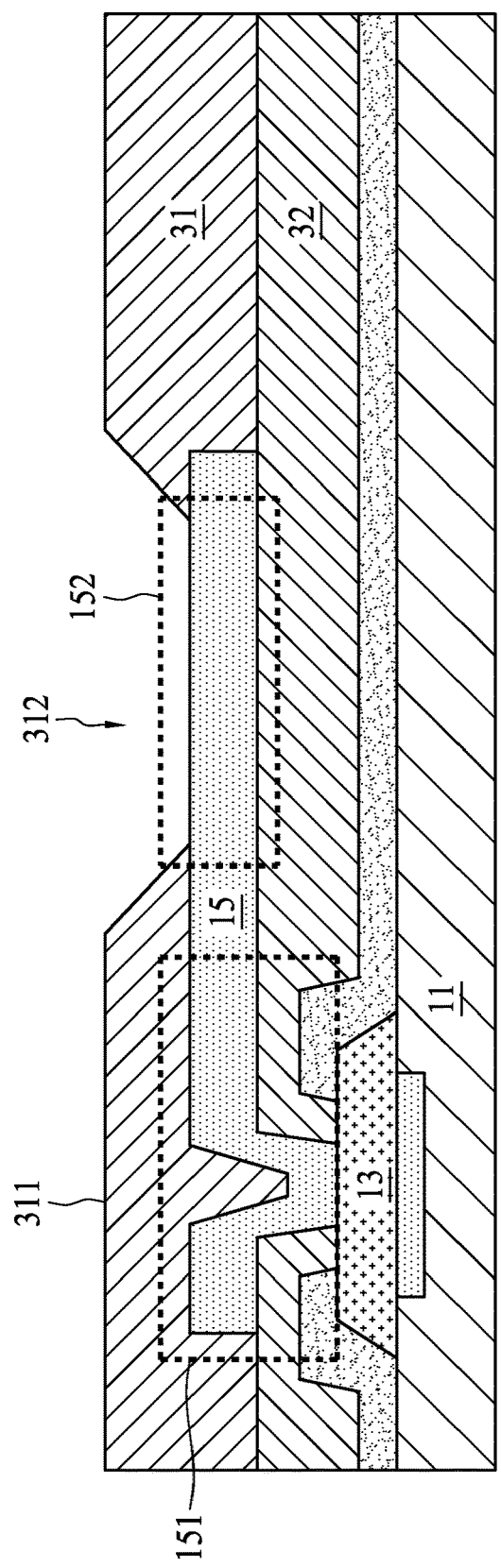
FIG. 17 is a cross-sectional view of a dielectric layer formed on the conductive layer and the insulation layer according to some embodiments of the present disclosure.

Referring to FIG. 17, the dielectric layer 31 is compliant to the morphology of the conductive layer 15 through PVD, CVD, printing, spin coating, sintering or thermal oxidation. A portion of the insulation layer 31 is removed by an etching process to expose a portion 152 of the conductive layer 15 and hence the opening 312 is formed in the dielectric layer 31.

Figure 18:
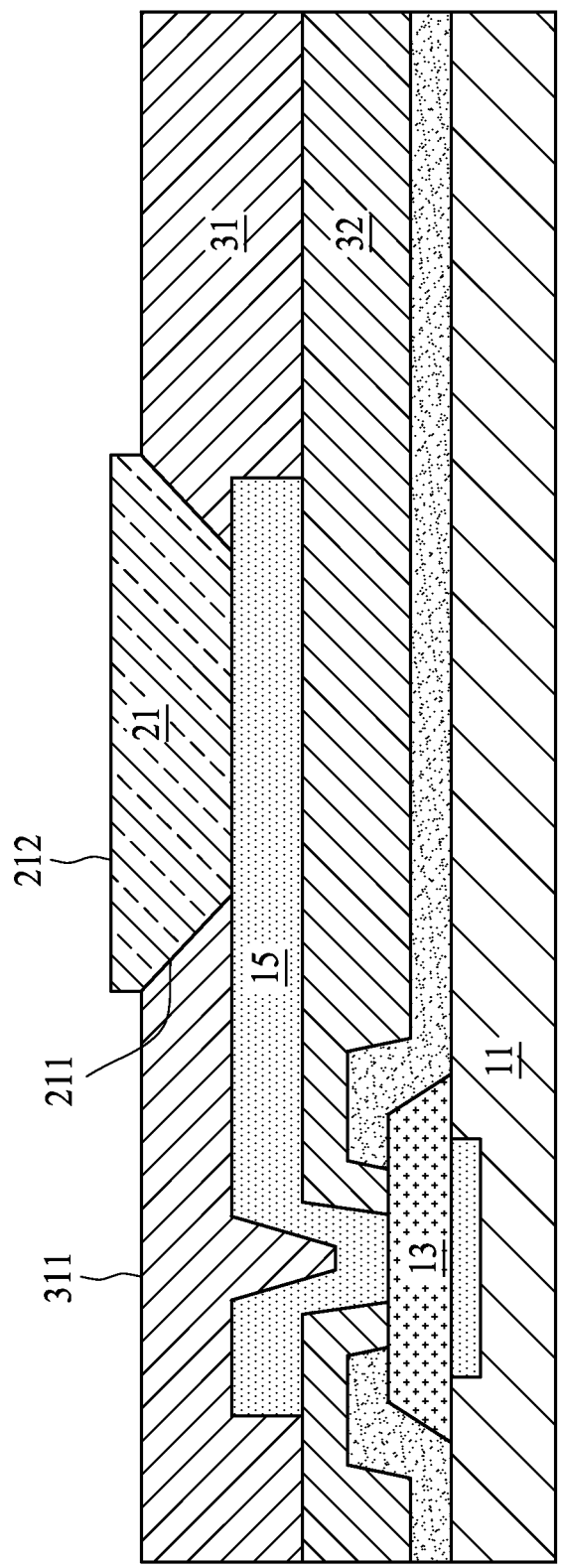
FIG. 18 is a cross-sectional view of a substantially filled conductive pad formed on the conductive layer according to some embodiments of the present disclosure.

Referring to FIG. 18, a conductive material is filled in the opening 312 to overflow the top surface 311 of the dielectric layer 31; meanwhile, a substantially filled conductive pad (or called metal bump) 21 with a protrusion is over the top surface 311 of the dielectric layer 31. The formation of the substantially filled conductive pad 21 uses PVD, CVD, electrolytic plating, or an electroless plating process. In some embodiments, a top surface 212 is formed at a top of the substantially filled conductive pad 21 and is over the top surface 311 of the dielectric layer 31.

In some embodiments, the sidewall 211 of the substantially filled conductive pad 21 is surrounded by the dielectric layer 31 and hence the conductive layer 15 is protected from humidity.

Figure 19:
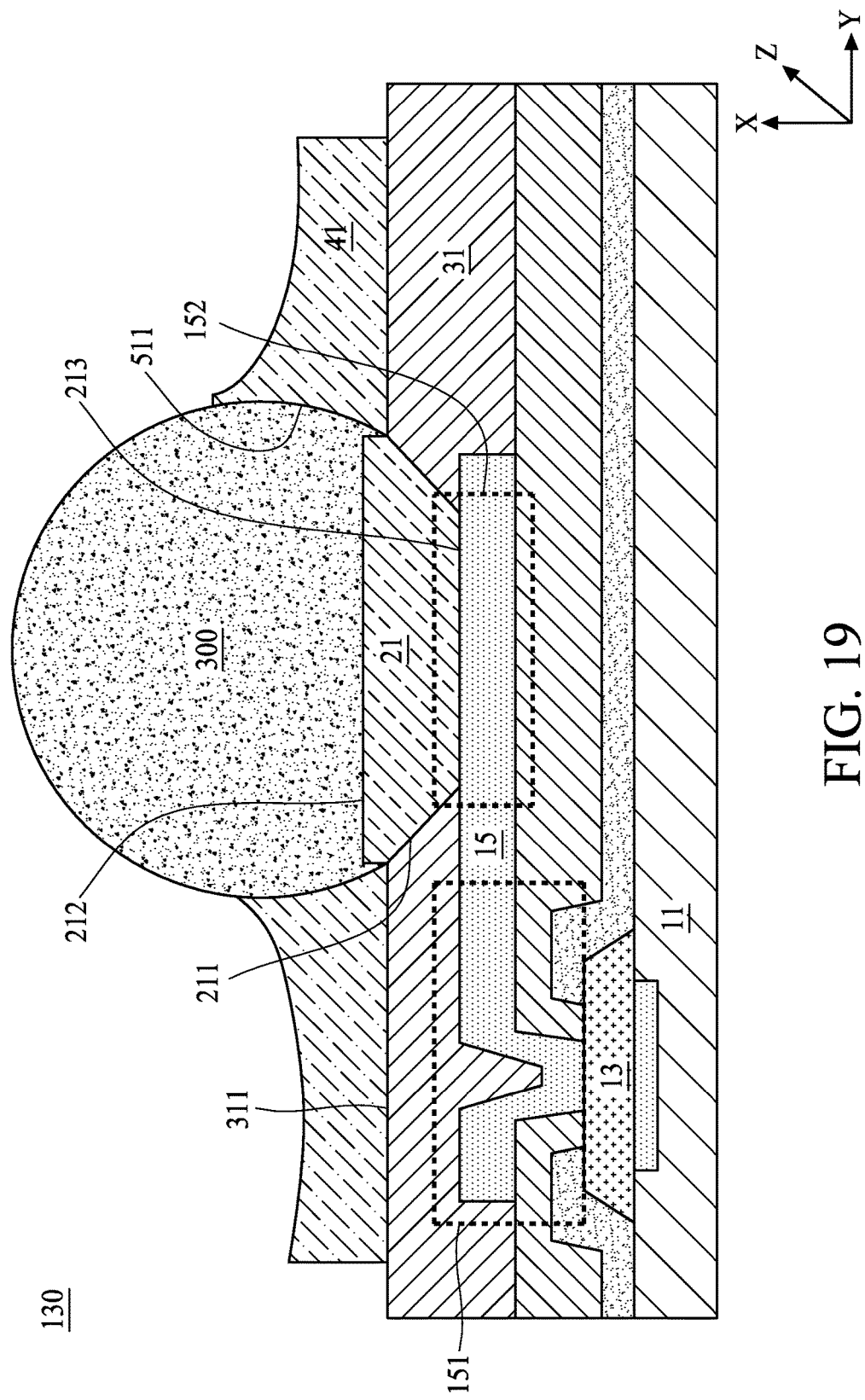
FIG. 19 is a cross-sectional view of a semiconductor device according to some embodiments of the present disclosure.

Referring to FIG. 19, a solder bump 300 is planted atop the substantially filled conductive pad 21 and the polymer layer 41 is compliant to the morphology of the dielectric layer 31 and the solder bump 300. In the semiconductor device 130, a portion of the polymer layer 41 is removed by an etching process to expose the solder bump 300 and hence the sidewall 511 of the solder bump 300 is surrounded by the polymer layer 41. In some embodiments, the protrusion of the substantially filled conductive pad 21 is surrounded by the polymer layer 41 to protect against humidity.

The polymer layer 41 is formed above the dielectric layer 31. In some embodiments, the coefficient of thermal expansion (CTE) of the polymer layer 41 is adjustable to be greater than the CTE of the dielectric layer 31. The CTE of the polymer layer 41 is adjusted according to its own thickness. Thus, the thickness of the polymer layer 41 is adjusted to be greater than the thickness of the dielectric layer 31.

Figure 20:
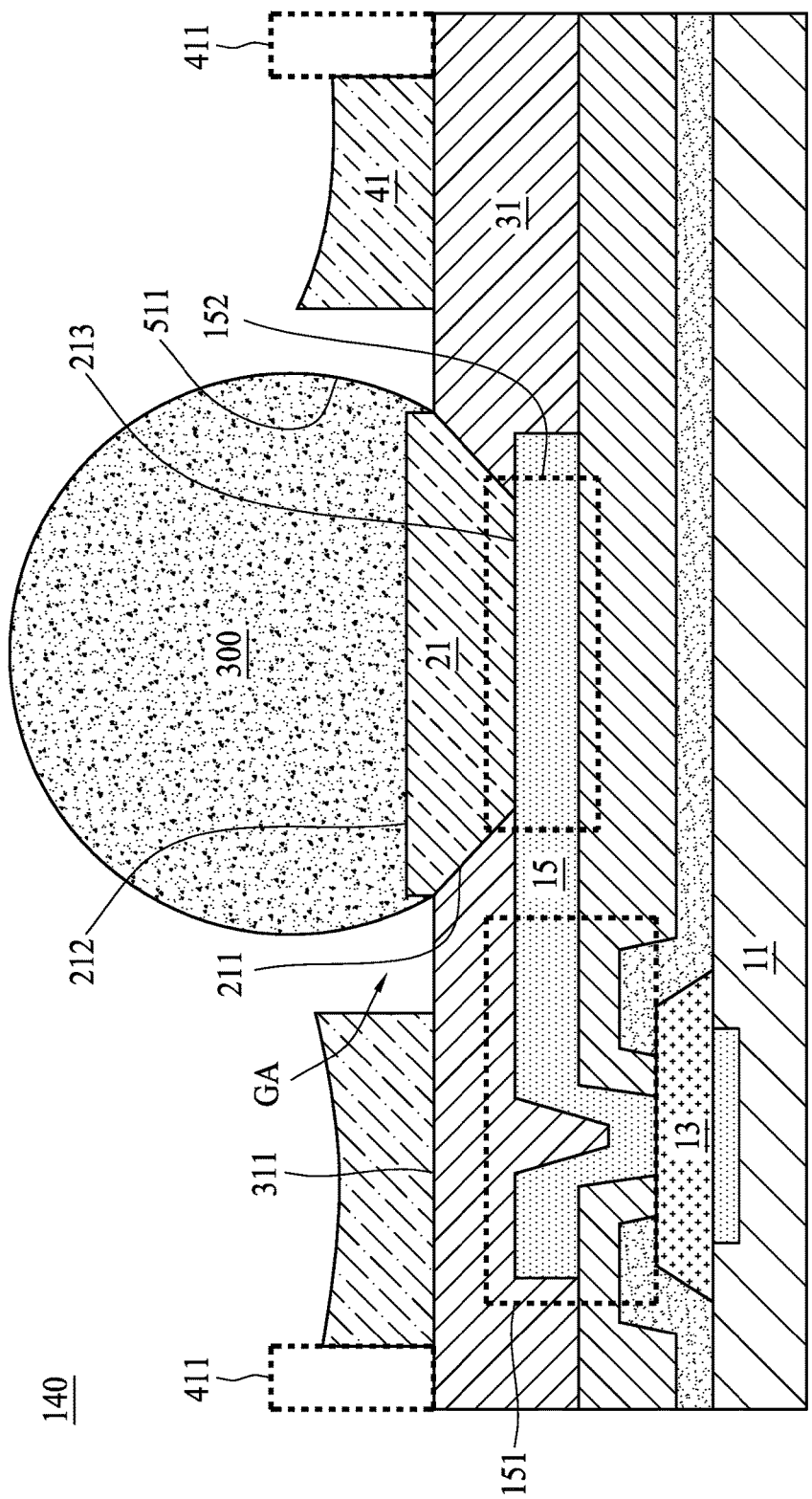
FIG. 20 is a cross-sectional view of a semiconductor device according to some embodiments of the present disclosure.

In some embodiments as shown in FIG. 20, the polymer layer 41 is spaced from the substantially filled conductive pad 21 with a predetermined gap GA. In the semiconductor device 140, a portion 411 of the polymer layer 41 is removed by an etching process to expose a portion of the dielectric layer 31 and hence the further process, such as singulation, is performed at the exposed portion of the dielectric layer 31.

In some embodiments, a semiconductor device includes a substrate, a pad on the substrate, a conductive layer, a metal bump and a dielectric layer. The conductive layer is electrically coupled to the pad at one end. The metal bump includes a top surface and a sidewall. The metal bump is configured to receive a solder bump. The metal bump is electrically coupled to the pad via the conductive layer. The dielectric layer surrounds the sidewall of the metal bump and has a top surface. The top surface is leveled to be above the top surface of the dielectric layer.

In some embodiments, a semiconductor device includes an oval-shaped pad and a dielectric layer. The oval-shaped pad is disposed on a carrier and includes a major axis corresponding to a largest distance of the oval-shaped pad. The major axis is toward a geometric center of the carrier. The dielectric layer surrounds the oval-shaped pad, which is configured to be in direct contact with a solder bump.

In some embodiments, a method for fabricating a semiconductor device includes providing a substrate. The method also includes disposing a pad on the substrate. The method also includes forming a conductive layer electrically coupled to the pad. The method also includes disposing a dielectric layer over the conductive layer. The method also includes forming an opening in the dielectric layer thereby exposing a portion of the conductive layer. The method also includes filling a conductive material in the opening to overflow a top surface of the dielectric layer. The method also includes forming a substantially filled conductive pad with a protrusion over the top surface of the dielectric layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or". In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising".

What is claimed is:

1. A semiconductor device, comprising:
a substrate;
a pad on the substrate;
a conductive layer electrically coupled to the pad at one end;
a metal bump having a top surface and a sidewall, wherein the metal bump is configured to receive a solder bump, wherein the metal bump is electrically coupled to the pad via the conductive layer;
a dielectric layer surrounding the sidewall of the metal bump and having a top surface, and the top surface of the metal bump entirely protruding the top surface of the dielectric layer; and
a polymer layer on the top surface of the dielectric layer, wherein an entire top surface of the polymer layer is a continuous curved surface, and an average thickness of the polymer layer is greater than a thickness of the dielectric layer, and wherein the polymer layer has a CTE greater than a CTE of the dielectric layer, and the polymer layer is spaced from both the sidewall of the metal bump and a nearest outer edge of the solder bump with a gap.

2. The semiconductor device of claim 1, wherein the sidewall of the metal bump is tapered.

3. The semiconductor device of claim 1, wherein the metal bump includes a bottom surface contacting with the conductive layer.

4. The semiconductor device of claim 1, wherein the metal bump has a thickness between about 8.0 µm and about 12.0 µm.

5. The semiconductor device of claim 1, wherein the metal bump is leveled to be above the top surface of the dielectric layer with a gap between about 1.0 µm and about 3.0 µm.

6. The semiconductor device of claim 1, wherein the metal bump includes Pb, Sn, Ni or Cu.

7. A semiconductor device, comprising:
an oval-shaped pad on a substrate; wherein the oval-shaped pad includes a major axis corresponding to a largest distance of the oval-shaped pad, and the major axis is toward a geometric center of the substrate;
a dielectric layer surrounding the oval-shaped pad and having a top surface, and
a polymer layer covering the dielectric layer and surrounding the oval-shaped pad;
wherein an entire top surface of the polymer layer is a continuous curved surface, an average thickness of the polymer layer is greater than a thickness of the dielectric layer, and the oval-shaped pad has a top surface entirely protruding the top surface of the dielectric layer, and the top surface of the oval-shaped pad is configured to be in direct contact with a solder bump, and
wherein a portion of the polymer layer over a singulation line is removed from the dielectric layer and thereby exposing the dielectric layer at the singulation line, and the polymer layer is spaced from both a sidewall of the oval-shaped pad and a nearest outer edge of the solder bump with a gap.

8. The semiconductor device of claim 7, wherein the oval-shaped pad is on a peripheral region of the substrate.

9. The semiconductor device of claim 7, further comprising a plurality of oval-shaped pads disposed symmetrically to the geometric center of the substrate.

10. The semiconductor device of claim 9, further comprising a non oval-shaped pad, wherein the oval-shaped pad has a same top surface area as the non oval-shaped pad.

11. A method for fabricating a semiconductor device, comprising:
providing a substrate;
disposing a pad on the substrate;
forming a conductive layer electrically coupled to the pad;
disposing a dielectric layer over the conductive layer;
forming an opening in the dielectric layer thereby exposing a portion of the conductive layer;
filling a conductive material in the opening to overflow a top surface of the dielectric layer;
forming a substantially filled conductive pad with a top surface entirely protruding the top surface of the dielectric layer;
planting a solder bump atop the substantially filled conductive pad;
forming a polymer layer above the dielectric layer, wherein an entire top surface of the polymer layer is a continuous curved surface, and an average thickness of the polymer layer is greater than a thickness of the dielectric layer; and spacing the polymer layer from both the substantially filed conductive pad and a nearest outer edge of the solder bump with a gap.

12. The method of claim 11, further comprising surrounding a sidewall of the substantially filled conductive pad with the dielectric layer.

13. The method of claim 11, further comprising forming a top surface at a top of the substantially filled conductive pad, wherein the top surface is over the top surface of the dielectric layer.

14. The method of claim 11, further comprising surrounding a sidewall of the solder bump with the polymer layer.

* * * * *